US012588502B2

(12) United States Patent
Zhou et al.

(10) Patent No.: US 12,588,502 B2
(45) Date of Patent: Mar. 24, 2026

(54) METHODS AND APPARATUS FOR INTEGRATING CARBON NANOFIBER INTO SEMICONDUCTOR DEVICES USING W2W FUSION BONDING

(71) Applicant: Micron Technology, Inc., Boise, ID (US)

(72) Inventors: Wei Zhou, Boise, ID (US); Bret K. Street, Meridian, ID (US); Amy R. Griffin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 591 days.

(21) Appl. No.: 17/728,625

(22) Filed: Apr. 25, 2022

(65) Prior Publication Data

US 2023/0343673 A1 Oct. 26, 2023

(51) Int. Cl.
*H01L 23/373* (2006.01)
*H01L 23/00* (2006.01)
*H01L 23/367* (2006.01)
*H01L 25/065* (2023.01)

(52) U.S. Cl.
CPC ...... *H01L 23/3737* (2013.01); *H01L 23/3675* (2013.01); *H01L 23/3735* (2013.01); *H01L 24/08* (2013.01); *H01L 24/80* (2013.01); *H01L 24/96* (2013.01); *H01L 24/97* (2013.01); *H01L 25/0657* (2013.01); *H01L 24/32* (2013.01); *H01L 2224/08221* (2013.01); *H01L 2224/32145* (2013.01); *H01L 2224/80896* (2013.01); *H01L 2225/06524* (2013.01); *H01L 2225/06589* (2013.01); *H01L 2924/1436* (2013.01)

(58) Field of Classification Search
CPC ............. H01L 23/3737; H01L 23/3735; H01L 23/3675
See application file for complete search history.

(56) References Cited

U.S. PATENT DOCUMENTS

| | | | |
|---|---|---|---|
| 8,669,181 B1* | 3/2014 | Yu ......................... | H01L 21/311 257/E21.582 |
| 9,994,741 B2* | 6/2018 | Hedrick ................. | H01L 24/13 |
| 2009/0008779 A1 | 1/2009 | Suhir et al. | |
| 2009/0072408 A1* | 3/2009 | Kabir ................. | B32B 38/0008 257/773 |
| 2011/0030938 A1* | 2/2011 | Liu ......................... | F28F 21/08 165/185 |

(Continued)

OTHER PUBLICATIONS

U.S. Appl. No. 17/728,586—Unpublished Patent Application to Wei Zhou et al., filed Apr. 25, 2022, titled "Methods and Apparatus for Integrating Carbon Nanofiber Into Semiconductor Devices Using W2W Fusion Bonding", 27 pages.

*Primary Examiner* — Dale E Page
*Assistant Examiner* — Wilner Jean Baptiste
(74) *Attorney, Agent, or Firm* — Dorsey & Whitney LLP

(57) ABSTRACT

A semiconductor device assembly that includes carbon nanofibers (CNFs) for heat dissipation has a CNF layer. Molding compound encapsulates the CNF layer to form an encapsulated CNF layer. The molding compound extends between individual adjacent CNFs within the encapsulated CNF layer, and upper edges of at least a portion of individual CNFs within the encapsulated CNF layer are exposed along an upper surface of the encapsulated CNF layer. The upper surface of the CNF layer is removably attached to a bottom surface of a carrier wafer.

14 Claims, 11 Drawing Sheets

(56)  References Cited

U.S. PATENT DOCUMENTS

| 2011/0080686 | A1   | 4/2011  | Farcy et al. |            |
|--------------|------|---------|--------------|------------|
| 2014/0374897 | A1 * | 12/2014 | Zhao         | F28F 21/081 |
|              |      |         |              | 438/584    |
| 2016/0260687 | A1 * | 9/2016  | Gao          | H01L 24/17 |
| 2017/0194105 | A1 * | 7/2017  | Zhamu        | H01G 11/24 |
| 2020/0165494 | A1 * | 5/2020  | Hedrick      | H01L 23/60 |
| 2023/0343672 | A1   | 10/2023 | Zhou et al.  |            |

* cited by examiner

200

400

402
Wafer Bumping

404
Mount Memory Wafer to a Carrier Wafer

406
Thin Memory Wafer

408
Apply SiO Layer

410
Prepare Surfaces for Fusion Bonding

412
Fusion Bonding

414
Remove Carrier Wafer(s)

416
Singulate Dies

METHODS AND APPARATUS FOR INTEGRATING CARBON NANOFIBER INTO SEMICONDUCTOR DEVICES USING W2W FUSION BONDING

CROSS-REFERENCE TO RELATED APPLICATION(S)

This application contains subject matter related to a concurrently-filed U.S. patent application by Wei Zhou et al., entitled "METHODS AND APPARATUS FOR INTEGRATING CARBON NANOFIBER INTO SEMICONDUCTOR DEVICES USING W2W FUSION BONDING". The related application, of which the disclosure is incorporated by reference herein, is assigned to Micron Technology, Inc., and is identified by U.S. application Ser. No. 17/728,586 filed Apr. 25, 2022.

TECHNICAL FIELD

The present technology is directed to semiconductor device packaging. More particularly, some embodiments of the present technology relate to techniques for improving the resilience and thermal conductivity of semiconductor devices and device assemblies.

BACKGROUND

Semiconductor dies, including memory chips, microprocessor chips, logic chips, and imager chips, can be assembled by mounting a plurality of semiconductor dies, individually or in die stacks, on a substrate in a grid pattern. Memory chips can be fabricated in a device wafer and then singulated. The assemblies and chips can be used in mobile devices, computing, and/or automotive products. A significant thermal issue can result from stacking many dies together and/or including multiple dies/chips in a small package or device. A robust and efficient thermal dispenser is needed to prevent overheating of semiconductor devices.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Figure 1A:
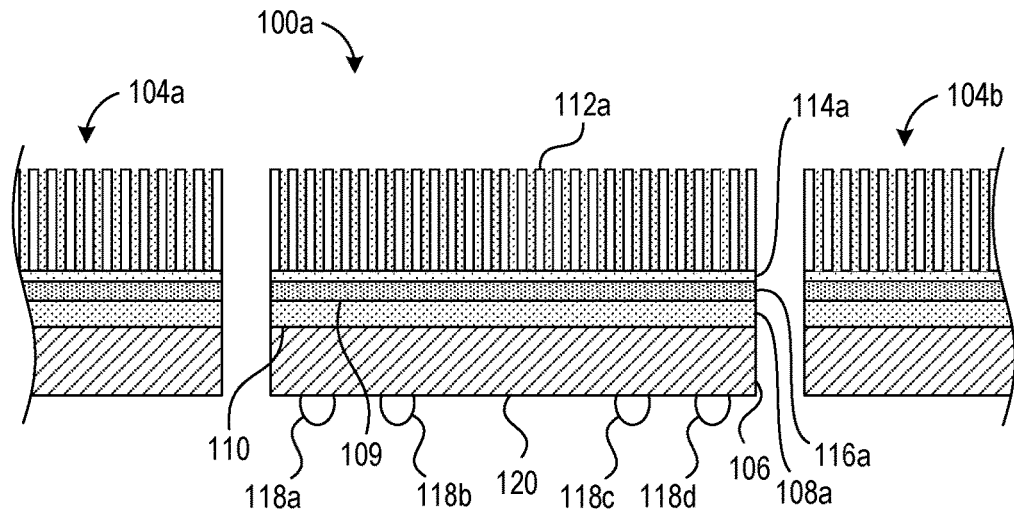
FIGS. 1A and 1B are side cross-sectional views of semiconductor device assemblies that include a carbon nanofiber (CNF) layer that is encapsulated with a molding compound in accordance with the present technology.

In general, carbon nanofibers (CNFs) have high thermal conductivity, i.e., higher than copper. CNFs are also extremely strong and thus have excellent mechanical performance. Further, CNFs can carry very high current density. These advantageous properties of CNFs make it an ideal material to incorporate into semiconductor packages. However, in order to have a reliable and aligned growth, the process to grow CNFs requires a high temperature, i.e., at least or greater than 400 degrees Celsius. Therefore, conventional techniques do not allow the CNFs to be grown directly on a chip such as a dynamic random access memory (DRAM) as the chip cannot sustain such a high process temperature.

To overcome the limitations of the conventional techniques, methods and apparatus are described herein for growing CNFs on currently available semiconductor materials and within dimensions that will facilitate the incorporation of CNFs into semiconductor packages. In some embodiments, the CNFs can be grown in a layer on semiconductors substrates, such as, but not limited to, silicon substrates. The silicon substrate can withstand the extreme heat required to grow the CNFs. The silicon substrate can be a standard wafer size and shape, providing the advantage of creating a CNF layer that can easily be attached to other wafers.

An expected advantage of the embodiments discussed below include improved mechanical properties that are realized by providing a strong structure that includes both the CNFs and a molding compound. The molding compound impregnates or flows between individual adjacent CNFs to enhance strength, structural support, and stabilization. The encapsulated CNF layer can be thinned to a desired thickness and to expose upper edges of the CNFs. Further, the mixed thermal conductivity of the CNFs and the molding compound can still be as high as 600 W/MK, thus approximately two-times higher than copper and five-times higher than silicon.

A further advantage is that the encapsulated CNF layer can be attached directly to a DRAM or other wafer, such as with fusion bonding or other bonding processing (e.g., bonding of silicon layers, oxide to oxide layers, etc.). After any carrier wafer(s) are removed, the chips can be singulated to form DRAM or other controllers, memory devices, device assemblies, etc., that include an encapsulated CNF layer that provides improved thermal dissipation.

Another expected advantage of the embodiments discussed herein include forming die stacks that include the CNF layer. A plurality of die stacks can be formed on a reconstituted wafer, i.e., a wafer that includes a plurality of memory or other chips. The wafer-sized and shaped encapsulated CNF can be attached directly to top chips of the die stacks, and then the die stacks can be singulated.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-9. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below," "top," and "bottom" can refer to relative directions or positions of features in the semiconductor devices in view of the orientation shown in the Figures. For example, "upper," "uppermost," or "top" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. Also, as used herein, features that are, can, or may be substantially equal are within 10% of each other, or within 5% of each other, or within 2% of each other, or within 1% of each other, or within 0.5% of each other, or within 0.1% of each other, according to various embodiments of the disclosure.

Figure 1B:
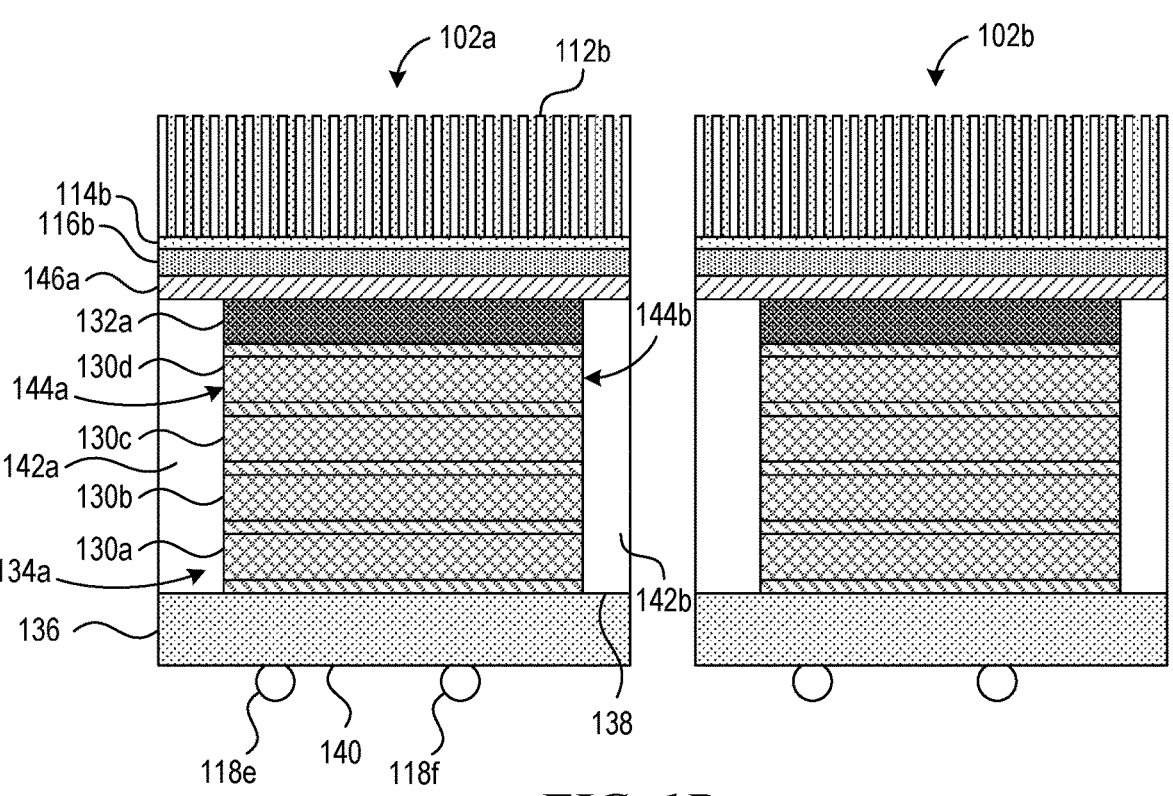

FIGS. 1A and 1B illustrate an overview of the present technology, while FIGS. 2-9 illustrate further details of the present technology. Like reference numbers relate to similar components and features in FIGS. 1A, 1B, 3A-3E, 5A-5G, and 7A-8. The present technology addresses the technical problem of thermal performance, which can cause overheating of individual chips, dies, and/or device assemblies, resulting in complete or partial failure of component(s). A CNF layer, directly attached to or integrated with chips and device assemblies can improve thermal dissipation and prevent overheating.

FIGS. 1A and 1B are side cross-sectional views of semiconductor device assemblies that include a carbon nanofiber (CNF) layer that is encapsulated with a molding compound in accordance with the present technology. FIG. 1A shows a device assembly 100a that has been formed using wafer-to-wafer (W2W) processing, such as fusion bonding, and then singulated, while FIG. 1B shows device assemblies 102a, 102b that have been formed using chip-to-wafer (C2W) processing. The CNF layer in both of the assemblies 100, 102 can be grown and encapsulated as discussed below in FIGS. 2 and 3A-3E before being included within the assemblies 100, 102, as discussed further below in FIGS. 4-7D.

Turning first to FIG. 1A, partial device assemblies 104a, 104b are shown to either side of the device assembly 100a, indicating that the assemblies 104a, 100a, 104b can be singulated from the same wafer. The device assembly 100a will be discussed in further detail. A memory device 106 (e.g., singulated from a DRAM device wafer) can have a silicon oxide (SiO) layer 108a over its upper surface 110. An encapsulated CNF layer 112a, which was grown from seed layer 114a (discussed further below in FIGS. 2-3B), can be attached (e.g., fusion bonded) to an outer surface 109 of the SiO layer 108a with an SiO layer 116a. Solder balls 118a, 118b, 118c, 118d can be attached to a bottom surface 120 of the memory device 106. Other attachments can be used. As discussed further below, the fusion bonding can occur prior to singulation.

The semiconductor device assemblies 102a, 102b shown in FIG. 1B can be singulated from the same wafer, such as a reconstituted wafer. In some embodiments, device assemblies 102a, 102b can be hybrid memory cubes (HMC) that use through-silicon vias (not shown) and microbumps (not shown), along with, in some cases, adhesive layers to interconnect a plurality of dies 130a, 130b, 130c, 130d, and top die 132a (e.g., memory cell arrays) together in a die stack 134a. The die stack 134a can be attached to a upper surface 138 of a memory device 136. The solder balls 118e, 118f can be attached to a bottom surface 140 of the memory device 136. Molding compound 142a, 142b encapsulates side edges 144a, 144b of the die stack 134a (only two side edges 144 are shown). The encapsulated CNF layer 112b, grown from the seed layer 114b, can be attached (e.g., fusion bonded or other bonding method) with the SiO layer 116b to a polymer layer 146a.

In other embodiments, different chips can be used instead of memory chips. The embodiments of FIGS. 1A and 1B apply equally to Flip Chip processes, fanout processes, etc. Because the encapsulated CNF layer 112 is formed separately from the device wafer and/or die stacks, the encapsulated CNF layer 112 can be used together with any chip where thermal conduction is desired.

Figure 2:
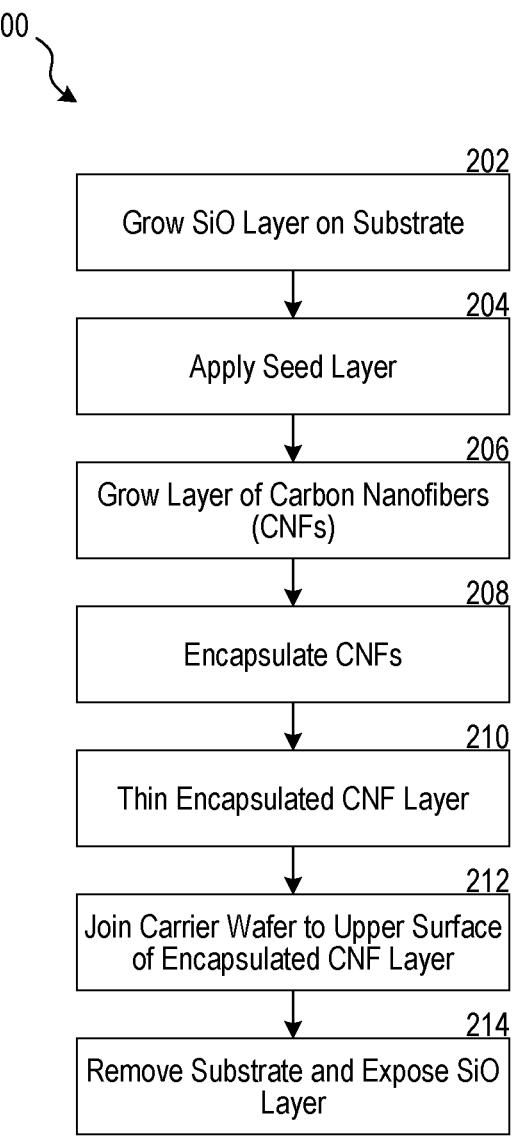
FIG. 2 is a flow chart of a method for manufacturing (i.e., growing) a CNF layer on a blanket wafer (e.g., semiconductor substrate) in accordance with the present technology.

FIG. 2 is a flow chart of a method 200 for growing a CNF layer on a blanket wafer (e.g., semiconductor substrate) in accordance with the present technology. FIGS. 3A-3E illustrate side cross-sectional views of the growth and fabrication of the CNF layer using the method 200 of FIG. 2 to form a semiconductor device assembly, referred to herein as a CNF assembly. The method 200 provides the ability to grow CNFs on a surface and within dimensions that are easily integrated into current semiconductor packaging processes. Only a portion of the wafer and CNF layer is shown in FIGS. 5A-5D.

Figure 3A:
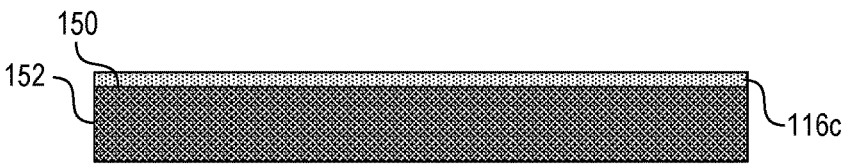
FIGS. 3A-3E illustrate side cross-sectional views of the growth and fabrication of the CNF layer using the method of FIG. 2 to form a CNF assembly in accordance with the present technology.

First turning to FIGS. 2 and 3A, the SiO layer 116c can be grown on or applied to an upper surface 150 of a substrate 152 (block 202). In other embodiments, a layer of silicon nitride (SiN), silicon carbon nitride (SiCN), or polymer can be used in place of the SiO layer 116c. By way of example, the SiO layer 116c (or other material) can be very thin, such as approximately 0.1 micron, less than 0.2 micron, or approximately 0.2 micron. The SiO layer 116c can provide an isolation or passivation layer on the upper surface 150, and therefore the CNFs will not be in direct contact with the substrate 152. In some embodiments, the substrate 152 can be made of silicon, but the technology is not so limited and other materials that can withstand high temperature are also contemplated. The substrate can be a 12-inch (e.g., 300 cm) diameter wafer, and therefore only a small portion of the substrate 152 is shown in the FIGS. 3A-3E. An expected advantage is that the SiO layer 116c can be exposed later in the assembly process when the substrate 152 is removed, providing a mounting surface suitable for fusion bonding to another surface, as discussed below in at least FIGS. 3E, 5E, and 7D.

Figure 3B:
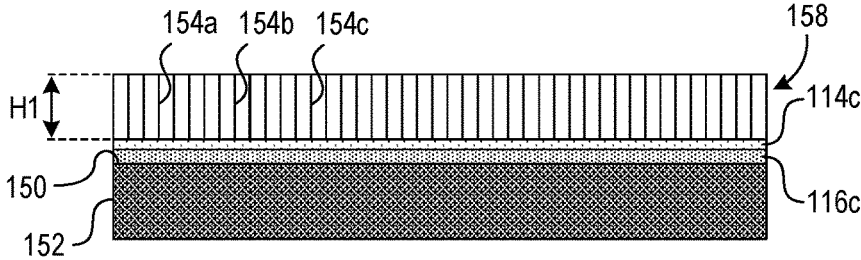

A titanium and copper (Ti/Cu) seed layer 114c can be applied to the SiO layer 116c on the substrate 152 (block 204) as shown in FIG. 3B. Other metals can be used as allowed and appropriate to the technology. In some embodiments, the seed layer 114c extends across a surface area of the SiO layer 116c. CNFs 154a, 154b, 154c (not all individual CNFs 154 are indicated) are grown on the substrate 152 (block 206) at a high temperature such as at least or greater than 400 degrees Celsius. It should be understood that many CNFs 154 are grown to form a CNF layer 158, and that the CNFs 154 are shown as simple lines for ease of illustration and description only. In some embodiments, the CNFs 154 can be grown to a height H1 of at least 200 microns. The height H1 may be determined based at least on the height restrictions of the final device, such as semiconductor device assemblies 100, 102 of FIGS. 1A and 1B.

Figure 3C:
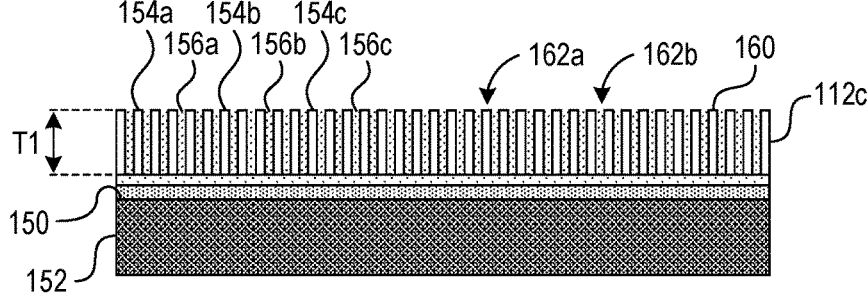

Using a wafer level molding process or other molding process, the CNFs 154 extending across the upper surface 150 of the substrate 152 can be encapsulated with a molding compound 156a, 156b, 156c (block 208) as shown in FIG. 3C. For example, the molding compound 156 can impregnate and/or penetrate into the CNF layer 158 (FIG. 3B), flowing and/or extending between at least some of the individual adjacent CNFs 154, to provide strength, structural support, and stabilization of the CNF layer 158. A variety of different materials and/or application methods (e.g., dipped, dispensed, deposited, etc.) can be used for the molding compound 156, such as an epoxy-based liquid compound with or without granules (e.g., particulate), a granular compound, thin-film based underfill or compound, resin-based encapsulant, polymer, etc. As in FIG. 3B, the CNFs 154 and the encapsulant there-between (e.g., molding compound 156) are shown and described as simple lines and/or blocks for ease of description only.

After the molding compound 156 has cured and/or hardened, the encapsulated CNF layer 112c can be thinned to a desired thickness T1 (block 210). The desired thickness T1 can be in a range of less than 100 microns, between 100 microns and 200 microns, around 200 microns, etc., depending, in some cases, upon the height restrictions of the final device. An upper surface 160 of the encapsulated CNF layer 112c can be ground, such as pulse grinding, to expose upper edges 162a, 162b (e.g., tips or ends) of the CNFs 154 and to create a smooth bonding surface. In some embodiments, the thickness T1 the encapsulated CNF layer 112 can be approximately equivalent to the height H1 of the CNFs 154.

Figure 3D:
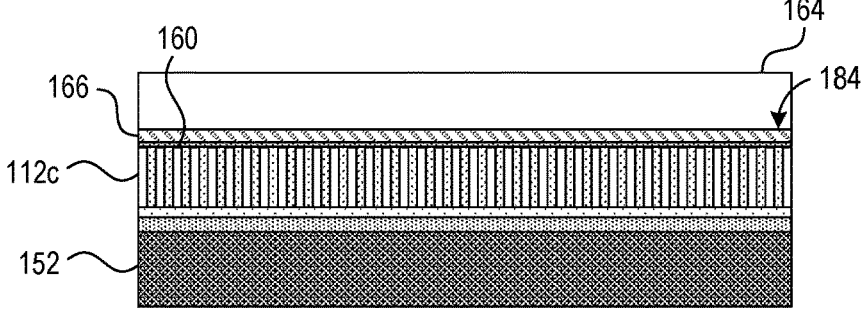

A bottom surface 184 of a carrier wafer 164 can be mounted on and/or joined to the upper surface 160 of the encapsulated CNF layer 112c (block 212) with an adhesive 166 as shown in FIG. 3D. The molding compound 156 within the encapsulated CNF layer 112c provides the further advantage of allowing the CNFs 154 to be securely attached to the carrier wafer 164 and to be handled while attached to the substrate 152 and/or after the substrate 152 is removed.

Figure 3E:
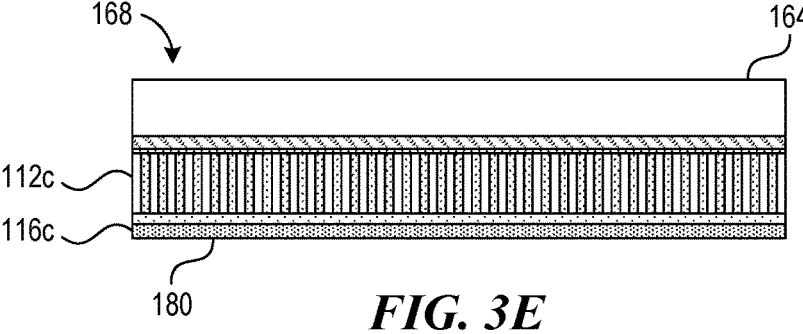

The substrate 152 can then be removed, such as by grinding/etching to expose the SiO layer 116c (block 214), resulting in a CNF assembly 168 that includes the encapsulated CNF layer 112c and the carrier wafer 164 as shown in FIG. 3E. The SiO layer 116c provides a mounting surface 180 that will be adhered to a mounting surface of another layer as discussed below in FIGS. 5E and 7D.

Figure 4:
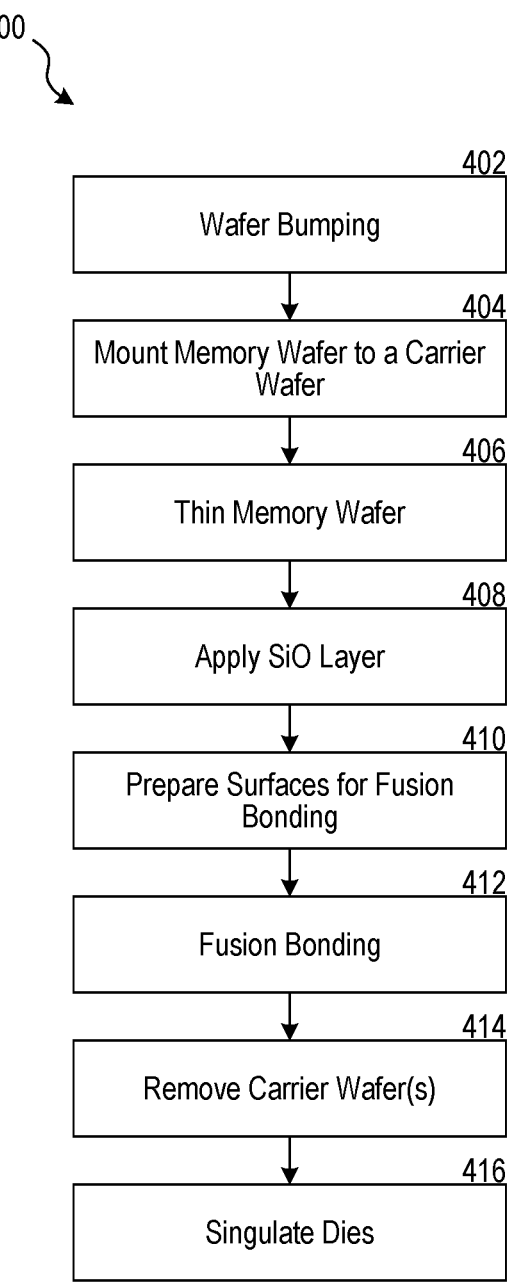
FIG. 4 is a flow chart of a method for using wafer-to-wafer technology to fabricate a wafer of memory dies (or other chips) that includes the encapsulated CNF layer in accordance with the present technology.

FIG. 4 is a flow chart of a method 400 for using wafer-to-wafer technology to fabricate a wafer of memory dies (or other chips) that includes the encapsulated CNF layer 112 in accordance with the present technology. Although the discussion herein is directed to a wafer of memory dies, it should be understood that the method to include the encapsulated CNF layer 112 can be applied to any type of die fabricated within a wafer. FIGS. 5A-5G illustrate side cross-sectional views of the fabrication of the wafer of memory dies with the encapsulated CNF layer 112 and will be discussed together with FIG. 4. Only a portion of the wafers and the encapsulated CNF layer 112 is shown.

6

Figure 5A:
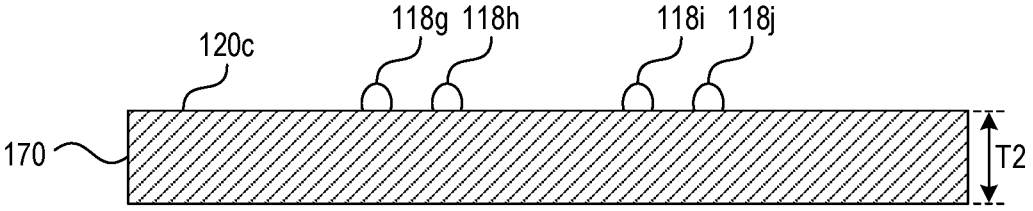
FIGS. 5A-5G illustrate side cross-sectional views of the fabrication of the semiconductor device assemblies using the wafer-to-wafer technology in accordance with the present technology.

A plurality of the solder balls 118g, 118h, 118i, 118j can be attached/applied, such as by a wafer bumping process, on the bottom surface 120c (e.g., active surface) of a semiconductor wafer that includes a plurality of semiconductor devices, such as a memory wafer 170, (block 402). FIG. 5A shows the memory wafer 170, such as a DRAM wafer, having a thickness T2. Interconnections other than the solder balls 118 can be used.

Figure 5B:
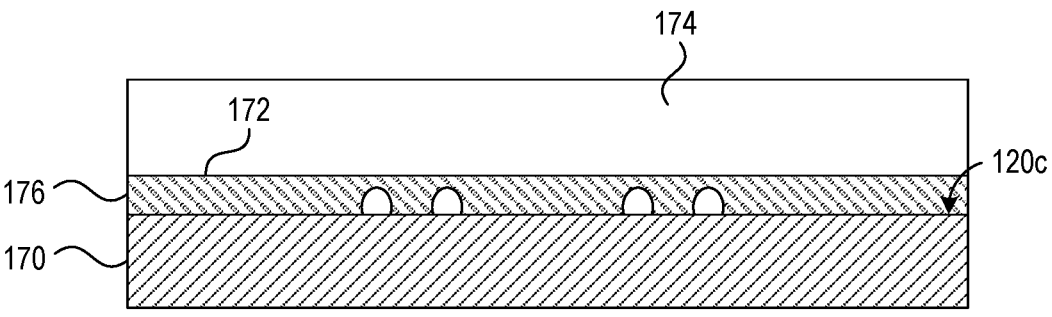

The bottom surface 120c of the memory wafer 170 can be directly mounted to a surface 172 (e.g., backside) of a carrier wafer 174, such as with an adhesive 176 (block 404), as shown in FIG. 5B.

Figure 5C:
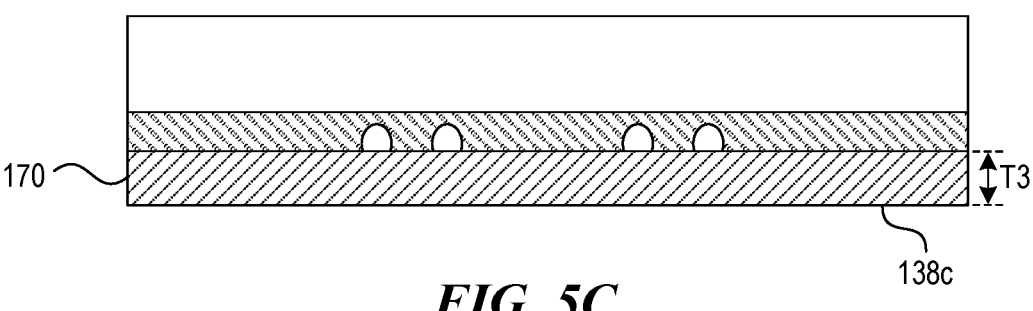

The memory wafer 170 can be thinned to a thickness T3, exposing the upper surface 138c (block 406). The thickness T3 of the memory wafer 170 as shown in FIG. 5C is less than the thickness T2 in FIG. 5A. In some embodiments, the memory wafer 170 can be thinned to be about 50 microns or less, but the embodiments are not so limited.

Figure 5D:
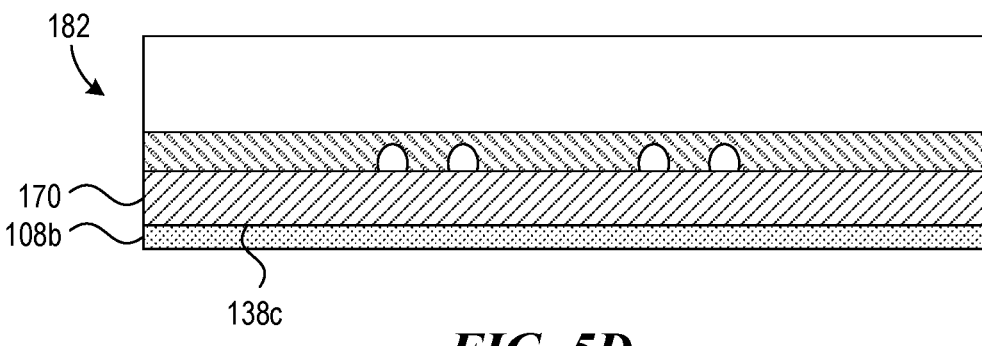

A coating or layer, such as the SiO layer 108b, can be applied to or adhered to the upper surface 138c of the memory wafer 170 (block 408) to form a memory wafer assembly 182 as shown in FIG. 5D.

Figure 5E:
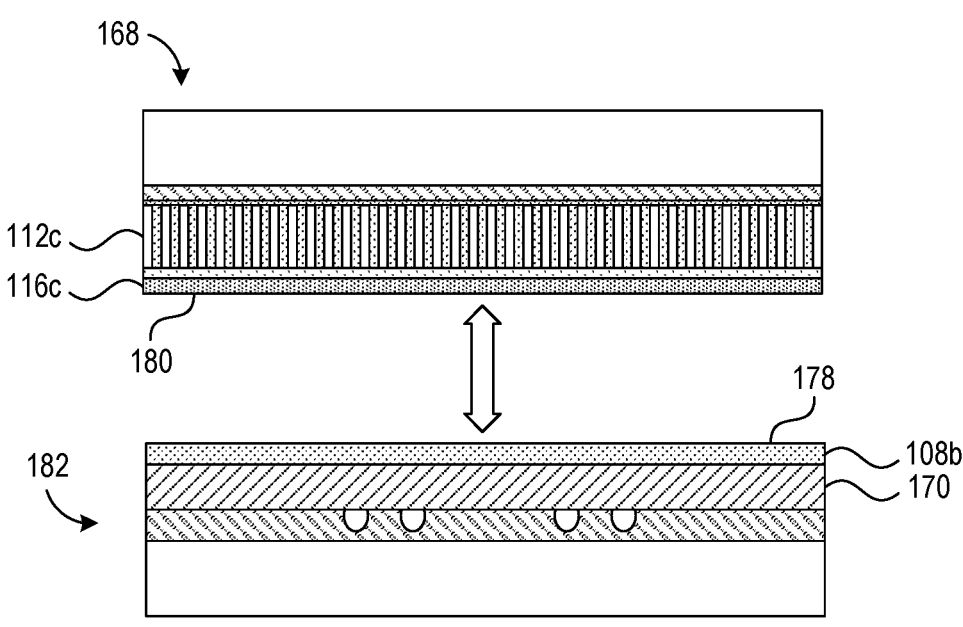

Turning to FIG. 5E, the memory wafer assembly 182 of FIG. 5D has been rotated such that a mounting surface 178 of the SiO layer 108b faces the mounting surface 180 of the CNF assembly 168 of FIG. 3E. Referring also to FIG. 4, the mounting surface 178 of the SiO layer 108b (of the memory wafer assembly 182) and the mounting surface 180 of the encapsulated CNF layer 112c (of the CNF assembly 168) can be prepared for fusion bonding (block 410). For example, a sanding process or other process, such as a plasma treatment, can be accomplished on one or both of the mounting surfaces 178, 180, such as to improve adhesion.

Figure 5F:
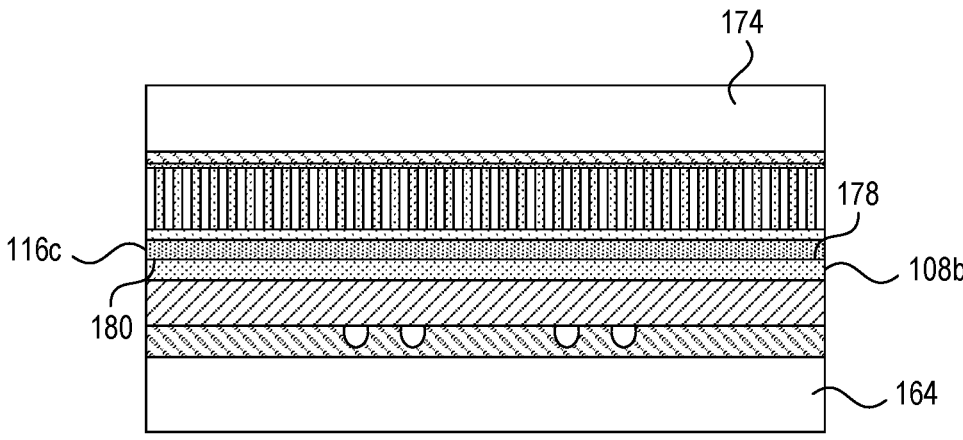

Fusion bonding can be accomplished (block 412) to join the memory wafer assembly 182 and the CNF assembly 168 (see FIG. 5F). For example, silicon oxide layer bonding (e.g., covalent bonding) can be used. Accordingly, in some embodiments when the memory wafer assembly 182 and the CNF assembly 168 are pressed together, chemical bonds are formed between the two mounting surfaces 178, 180, securely holding the layers together. In other embodiments, the memory wafer assembly 182 and the CNF assembly 168 can be pressed together, and in some cases, heat can be applied. In yet further embodiments, polymer (not shown) could be used instead of one or both of the SiO layers 108b, 116c. However, when using polymer, thermal conduction can diminish compared to using SiO.

Figure 5G:
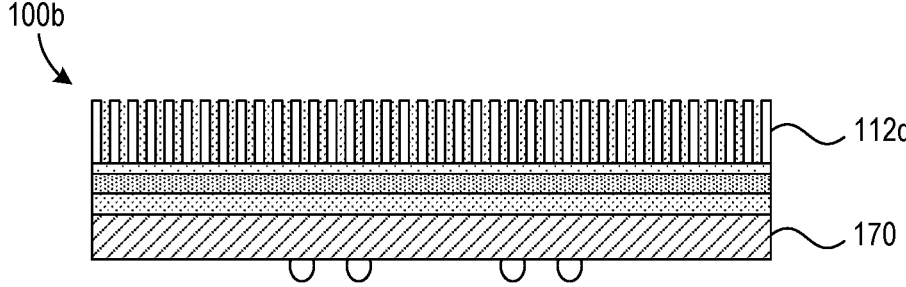

The carrier wafers 164, 174 can then be removed (block 414), resulting in a semiconductor device assembly 100b that includes the embedded heatsink functionality of the encapsulated CNF layer 112d with the memory wafer 170 as shown in FIG. 5G.

Individual memory dies can then be singulated (block 416). Referring to FIG. 1A, the device assembly 100a can include one of the singulated memory dies.

Figure 6:
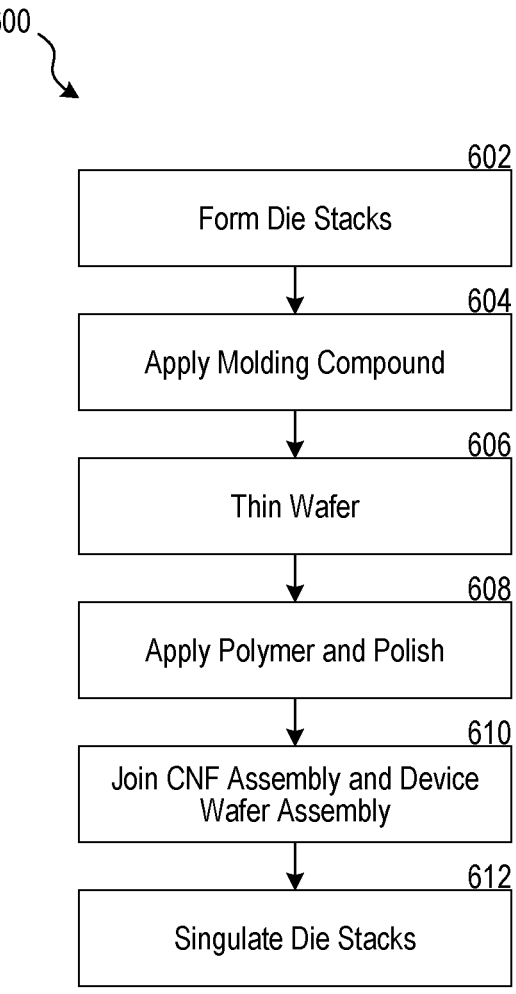
FIG. 6 is a flow chart of a method for using chip-to-wafer technology to fabricate a plurality of semiconductor device assemblies that include the encapsulated CNF layer in accordance with the present technology.

FIG. 6 is a flow chart of a method 600 for using chip-to-wafer technology to fabricate a plurality of semiconductor device assemblies 102 that include the encapsulated CNF layer 112 in accordance with the present technology. FIGS. 7A-7D illustrate side cross-sectional views of the fabrication of the semiconductor device assemblies 102 using chip-to-wafer technology and will be discussed together with FIG. 6.

Figures 7A, 7B:
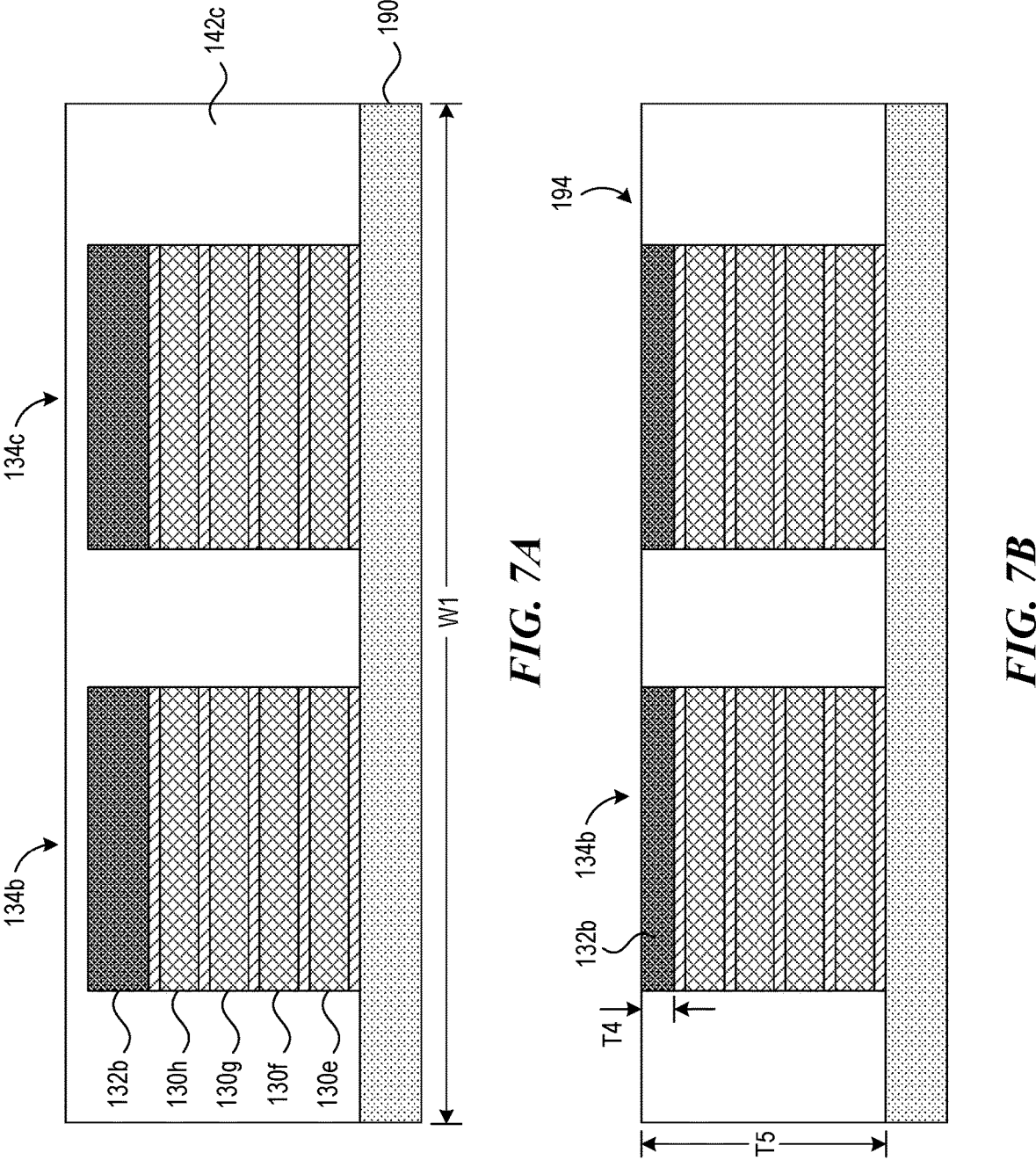
FIGS. 7A-7D illustrate side cross-sectional views of the fabrication of the semiconductor device assemblies using the chip-to-wafer technology in accordance with the present technology.

A plurality of the die stacks 134b, 134c (not all are shown) can be formed across a width W1 of a device wafer 190 using chip-to-wafer technology and/or techniques (block 602), as shown in FIG. 7A. Only a small portion of the device wafer 190 is shown and thus width W1 simply represents the entire width of the device wafer 190 (e.g., 12 inches or 300 cm). The device wafer 190 can be a reconstituted structure having many memory dies or logic dies therein that are not yet singulated. For example, the dies 130*e*, 130*f*, 130*g*, 130*h*, and the top die 132*b*, can be attached to the device wafer 190 and/or to each other using adhesive or other techniques to form the die stack 134*b*.

The die stacks 134 can be molded with molding compound 142*c* (block 604). The molding compound 142*c* and the top die(s) 132 can then be thinned to thin the top die(s) 132 to a thickness T4 and/or the die stack(s) 134 to a thickness T5 as shown in FIG. 7B (block 606). An upper surface 194, which includes upper surfaces of the top dies 132 and the molding compound, can be exposed.

Figures 7C, 7D:
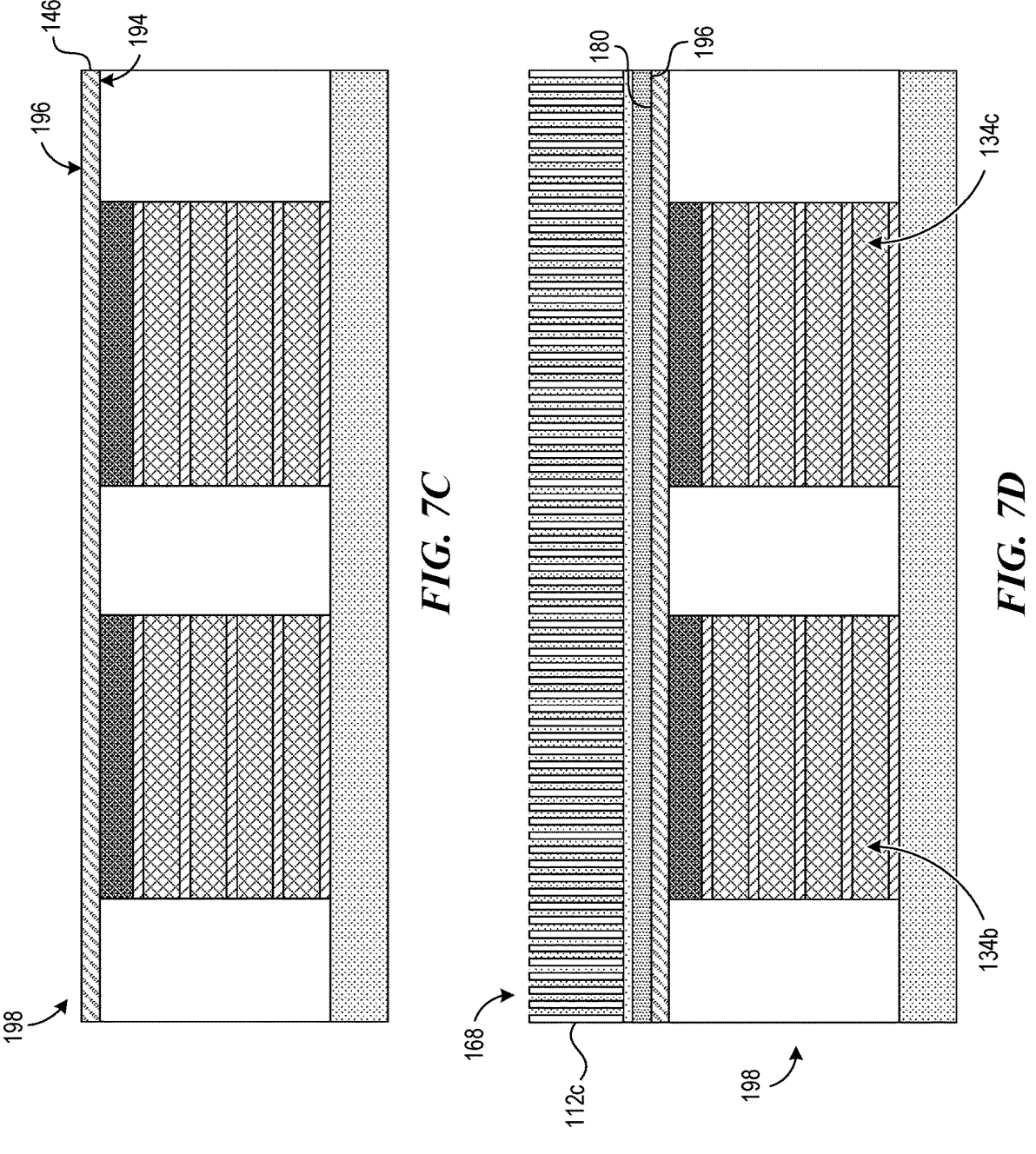

A thin polymer layer 146*b* can be applied to the upper surface 194 (block 608) as shown in FIG. 7C to form device wafer assembly 198. Polymer materials such as polybenzoxazoles (PBO) can be used, but the embodiments are not so limited. The polymer layer 146*b* can be polished to smooth the mounting surface 196 and/or thin the polymer layer 146*b* if needed. In some embodiments, the polymer layer 146*b* can be thinner than the encapsulated CNF layer 112*c*, such as approximately one micron, approximately two microns, greater than two microns, within a range of a half micron to two microns, or within a range of one micron to two microns, i.e., thick enough to provide reasonable bonding while allowing the thermal conductivity.

The mounting surface 180 of the CNF assembly 168 (FIG. 3E) can be attached to the mounting surface 196 of the device wafer assembly 198 (block 610) as shown in FIG. 7D. For example, the CNF assembly 168 and the device wafer assembly 198 can be joined, in some embodiments, by cold welding (e.g., by pushing the mounting surfaces 180, 196 together and adding heat). In other embodiments fusion bonding, hybrid bonding, oxide to oxide bonding, or dielectric to dielectric bonding can be used. In yet other cases, an additional adhesive (not shown) can be used. In the configurations including an adhesive such as polymer (e.g., the polymer layer 146*b*), there can be a thermal tradeoff as the thermal conduction from the cube structure of the die stack 134 to the encapsulated CNF layer 112 can be reduced.

Although not shown in FIG. 7D, in some embodiments the carrier wafer 164 (FIG. 3E) can also be used when attaching the CNF assembly 168. In that case, the carrier wafer 164 can be subsequently removed after the CNF assembly 168 and the device wafer assembly 198 are joined.

The dies stacks 134 are then singulated (block 612) to form the semiconductor device assembly(s) 102 as shown in FIG. 1B.

Figure 8:
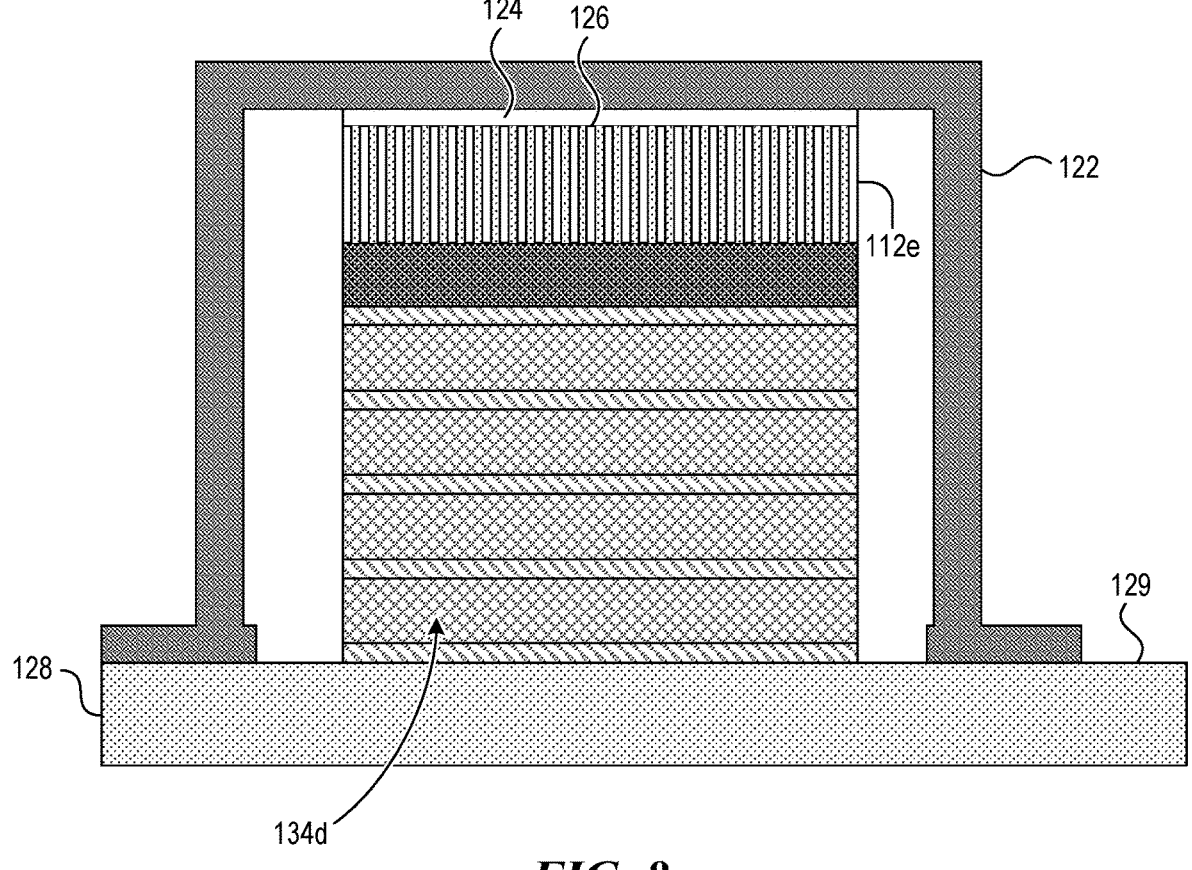
FIG. 8 shows an example of a die stack that can be a hybrid memory cube (HMC) that has a heat spreader attached over the encapsulated CNF layer in accordance with the present technology.

FIG. 8 shows an example of a die stack 134*d* that can be an HMC that has a heat spreader 122 attached over the encapsulated CNF layer 112*e*. A layer of material 124, such as SiO or polymer, can be used to join an upper surface 126 of the encapsulated CNF layer 112*e* and the heat spreader 122. The heat spreader 122 can also be attached to a surface 129 of wafer 128. In some embodiments, the heat spreader 122 can be attached prior to applying the molding compound (not shown). The heat spreader 122 can provide improved mechanical and thermal performance for standalone HMC applications.

Figure 9:
FIG. 9 is a schematic view showing a system that includes a semiconductor device assembly configured in accordance with an embodiment of the present technology.
Figure 9:
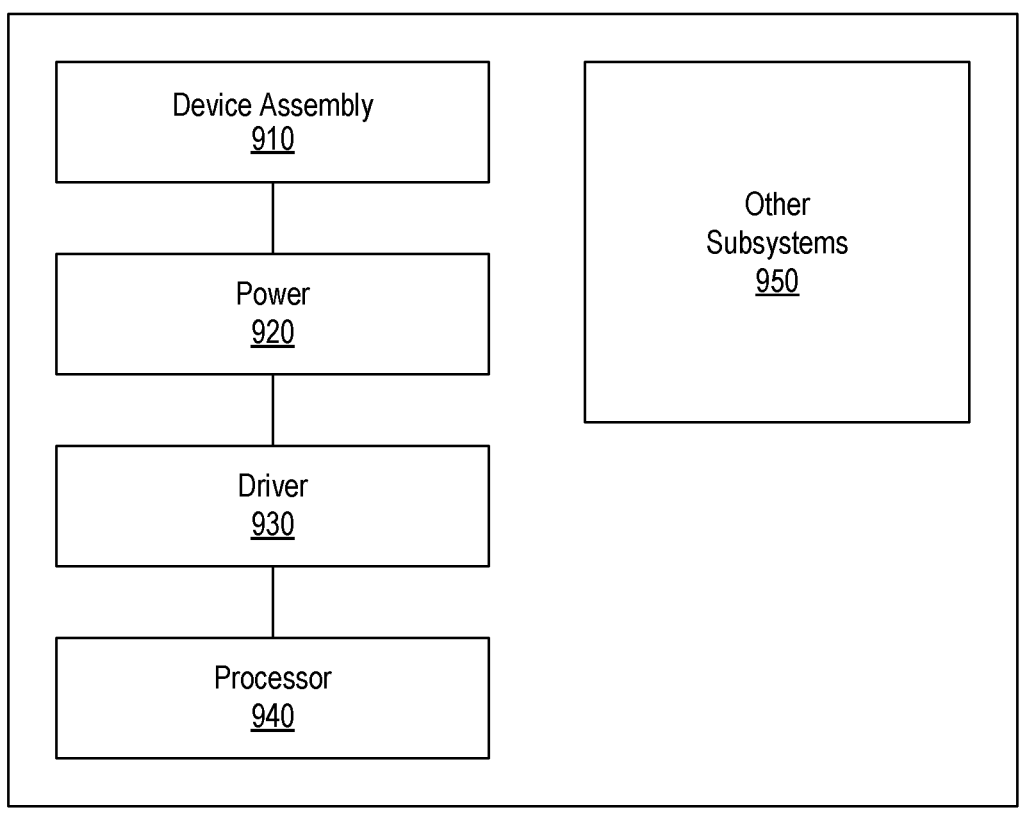

Any one of the semiconductor devices, assemblies, and/or packages described above with reference to FIGS. 1A-8 can be incorporated into any of a myriad of larger and/or more complex systems, a representative example of which is system 900 shown schematically in FIG. 9. The system 900 can include a semiconductor device assembly 910, a power source 920, a driver 930, a processor 940, and/or other subsystems or components 950. The semiconductor device assembly 910 can include features generally similar to those of the semiconductor device assemblies described above. The resulting system 900 can perform any of a wide variety of functions such as memory storage, data processing, and/or other suitable functions. Accordingly, representative systems 900 can include, without limitation, hand-held devices (e.g., mobile phones, tablets, digital readers, and digital audio players), computers, vehicles, and other machines and appliances. Components of the system 900 may be housed in a single unit or distributed over multiple, interconnected units (e.g., through a communications network). The components of the system 900 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor device assembly including carbon nanofibers for heat dissipation, comprising:

a carbon nanofiber (CNF) layer;

molding compound encapsulating the CNF layer to form an encapsulated CNF layer, the molding compound extending between individual adjacent CNFs within the encapsulated CNF layer;

a metal seed layer extending across and in direct contact with a bottom surface of the encapsulated CNF layer;

a silicon oxide (SiO) layer extending across and in direct contact with a bottom surface of the metal seed layer; and a plurality of die stacks formed over a device wafer, wherein the plurality of die stacks are encapsulated in second molding compound, wherein upper surfaces of the die stacks and the second molding compound are bonded to the SiO layer.

2. The semiconductor device assembly of claim 1, wherein the device wafer and the encapsulated CNF layer are approximately 12 inches or 300 cm in diameter.

3. The semiconductor device assembly of claim 1, wherein upper edges of at least a portion of individual CNFs within the encapsulated CNF layer are exposed along an upper surface of the encapsulated CNF layer.

4. The semiconductor device assembly of claim 1, wherein each of the plurality of die stacks include an equal number of die.

5. The semiconductor device assembly of claim 1, wherein a polymer layer extends between the SiO layer and the upper surfaces of the die stacks and the second molding compound, wherein the polymer layer and the SiO layer are fusion bonded to each other.

6. The semiconductor device assembly of claim 1, wherein a polymer layer extends between the SiO layer and the upper surfaces of the die stacks and the second molding compound, wherein the polymer layer and the SiO layer are cold welded to each other.

7. The semiconductor device assembly of claim 6, wherein the polymer layer has a thickness that is between about 0.5 and 2.0 microns.

8. The semiconductor device assembly of claim 1, wherein the molding compound encapsulating the CNF layer comprises at least one of an epoxy-based liquid compound with granules, an epoxy-based liquid compound without granules, a granular compound, a thin-film based underfill, a thin-film based compound, a resin-based encapsulant, or a polymer.

9. The semiconductor device assembly of claim 1, wherein a thickness of the encapsulated CNF layer less than or equal to about 200 microns.

10. A semiconductor device assembly including carbon nanofibers for heat dissipation, comprising:

a carbon nanofiber (CNF) layer;

molding compound encapsulating the CNF layer to form an encapsulated CNF layer, the molding compound extending between individual adjacent CNFs within the encapsulated CNF layer, and wherein upper edges of at least a portion of individual CNFs within the encapsulated CNF layer are exposed along an upper surface of the encapsulated CNF layer;

a metal seed layer extending across and in direct contact with a bottom surface of the encapsulated CNF layer;

a silicon oxide (SiO) layer extending across a bottom surface of the metal seed layer; and a die stack formed over a memory device, wherein the die stack includes at least two dies that are attached to each other, wherein the die stack is encapsulated in second molding compound, wherein an upper surface of the die stack and the molding compound is bonded to the SiO layer.

11. The semiconductor device assembly of claim 10, further comprising a polymer layer extending across the upper surface of the die stack and the molding compound, wherein the polymer layer is further bonded to the SiO layer.

12. The semiconductor device assembly of claim 11, wherein the polymer layer is thinner than the encapsulated CNF layer.

13. The semiconductor device assembly of claim 10, wherein the bonding between the SiO layer and the die stack is one of cold welding, fusion bonding, oxide to oxide bonding, or dielectric to dielectric bonding.

14. The semiconductor device assembly of claim 10, wherein the molding compound encapsulating the CNF layer comprises at least one of an epoxy-based liquid compound with granules, an epoxy-based liquid compound without granules, a granular compound, a thin-film based underfill, a thin-film based compound, a resin-based encapsulant, or a polymer.

* * * * *